(12) United States Patent
Tanizawa

(10) Patent No.: US 9,350,370 B2
(45) Date of Patent: May 24, 2016

(54) SENSOR SIGNAL PROCESSING APPARATUS AND SENSOR APPARATUS

(71) Applicant: DENSO CORPORATION, Kariya, Aichi-pref. (JP)

(72) Inventor: Yukihiko Tanizawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/758,613

(22) PCT Filed: Jan. 21, 2014

(86) PCT No.: PCT/JP2014/000266
§ 371 (c)(1),
(2) Date: Jun. 30, 2015

(87) PCT Pub. No.: WO2014/119247
PCT Pub. Date: Aug. 7, 2014

(65) Prior Publication Data
US 2015/0358027 A1 Dec. 10, 2015

(30) Foreign Application Priority Data

Jan. 31, 2013 (JP) .................................. 2013-16878

(51) Int. Cl.
*H03M 1/06* (2006.01)
*H03M 1/46* (2006.01)
(Continued)

(52) U.S. Cl.
CPC ............ *H03M 1/0609* (2013.01); *G01D 3/0365* (2013.01); *G01K 7/16* (2013.01); *H03M 1/10* (2013.01); *H03M 1/462* (2013.01)

(58) Field of Classification Search
CPC ................ H03M 3/382; H03M 1/002; H03M 2201/4225; H03M 1/0607; H03M 1/12; H03M 2201/192; H03M 2201/4195

USPC .......................... 341/118–121, 139, 140, 142
See application file for complete search history.

(56) References Cited

U.S. PATENT DOCUMENTS 5,121,119 A   6/1992   Higuchi et al.
5,257,210 A * 10/1993   Schneider ................ G01D 3/02
                                                     702/109
(Continued)

FOREIGN PATENT DOCUMENTS

JP    H8-181610 A    7/1996
JP    H11-183273 A   7/1999
(Continued)

OTHER PUBLICATIONS

International Search Report of the International Searching Authority mailed Mar. 18, 2014 for the corresponding international application No. PCT/JP2014/000266 (and English translation).

(Continued)

*Primary Examiner* — Linh Nguyen
(74) *Attorney, Agent, or Firm* — Posz Law Group, PLC

(57) ABSTRACT

In a sensor signal processing apparatus, a control unit executes at least one of a temperature measurement process and a calculation process in parallel with a signal conversion process. In the temperature measurement process, the control unit causes a second A/D converter to execute the A/D conversion of a temperature signal. In the calculation process, the control unit calculates an offset and a conversion gain of a first A/D converter base on an A/D conversion value output from the second A/D converter and pre-prepared temperature characteristic data of a physical quantity sensor. In the signal conversion process, the control unit sets the calculated offset and the calculated conversion gain to the first A/D converter, and causes the first A/D converter to execute the A/D conversion of the sensor signal.

5 Claims, 10 Drawing Sheets

(51) Int. Cl.
  *G01K 7/16* (2006.01)
  *G01D 3/036* (2006.01)
  *H03M 1/10* (2006.01)

(56) References Cited

U.S. PATENT DOCUMENTS

| | | | | |
|---|---|---|---|---|
| 5,475,384 | A * | 12/1995 | Manenti | G01D 3/022 340/501 |
| 5,559,842 | A * | 9/1996 | Javitt | H03L 1/022 327/147 |
| 5,822,049 | A * | 10/1998 | Dimmick | G01J 9/0246 356/72 |
| 2003/0154781 | A1 | 8/2003 | Matsumura | |
| 2008/0259989 | A1 * | 10/2008 | Doorenbos | G01K 7/01 374/1 |
| 2010/0125426 | A1 * | 5/2010 | Kurtz | G01L 9/065 702/53 |
| 2010/0225332 | A1 | 9/2010 | Niwa et al. | |
| 2010/0332156 | A1 * | 12/2010 | Shimakata | G01L 19/02 702/50 |
| 2012/0075137 | A1 | 3/2012 | Tanizawa | |
| 2015/0057959 | A1 * | 2/2015 | Ezekwe | G01C 19/5776 702/96 |

FOREIGN PATENT DOCUMENTS

| | | |
|---|---|---|
| JP | 2001-217713 A | 8/2001 |
| JP | 2004-085562 A | 3/2004 |

OTHER PUBLICATIONS

Written Opinion of the International Searching Authority mailed Mar. 18, 2014 for the corresponding international application No. PCT/JP2014/000266 (and English translation).

* cited by examiner

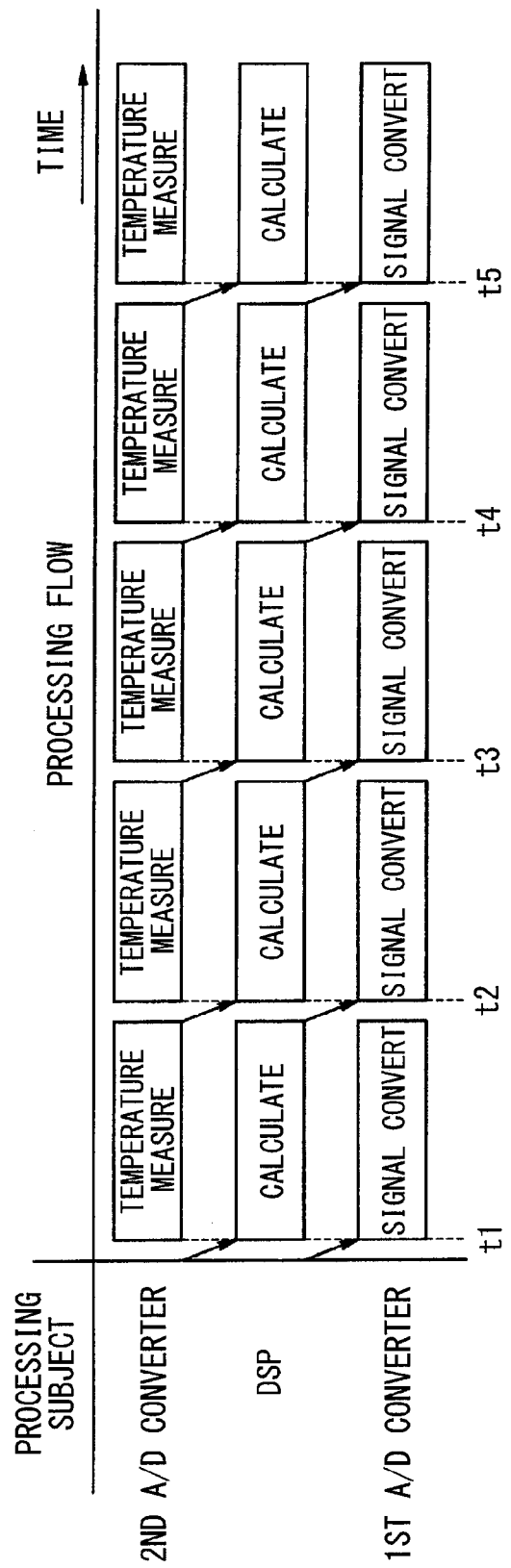

SENSOR SIGNAL PROCESSING APPARATUS AND SENSOR APPARATUS

CROSS-REFERENCE TO RELATED APPLICATIONS

The present disclosure is a U.S. national stage of International Application No. PCT/JP2014/000266 filed on Jan. 21, 2014 and is based on Japanese Patent Application No. 2013-16878 filed Jan. 31, 2013, the entire contents of which are incorporated herein by reference.

TECHNICAL FIELD

The present disclosure relates to a sensor signal processing apparatus and a sensor apparatus that perform A/D conversion on a sensor signal output from a physical quantity sensor, and output a converted signal.

BACKGROUND ART

Numerous physical quantity sensors have a temperature characteristic, and an offset and sensitivity of a sensor signal output by the physical quantity sensor vary with temperature. A sensor apparatus disclosed in PTL 1 includes a temperature sensor that outputs a temperature signal corresponding to an ambient temperature of the physical quantity sensor, and obtains A/D conversion values of the sensor signal and the temperature signal by selectively using one A/D converter. The sensor apparatus performs temperature correction for the A/D conversion value of the sensor signal with the use of the A/D conversion value of the temperature signal.

In the conventional configuration described above, the A/D conversion of the temperature signal, the A/D conversion of the sensor signal, and the temperature correction process are sequentially performed. For that reason, a delay corresponding to sum of at least an A/D conversion time and a temperature correction calculation time of the sensor signal occurs until A/D conversion data subjected to temperature correction is obtained since the A/D conversion of the sensor signal starts (sample & hold starts). The above delay time is not reduced even if the above configuration changes to a configuration in which a dedicated A/D converter is provided for each of the physical quantity sensor and the temperature sensor.

In the temperature correction process, there is a need to correct the offset and an inclination of the A/D conversion data. Those correction calculations include four arithmetic operations, and therefore require a time. In particular, the calculation time increases in multiplication and division. As a result, the delay time since the A/D conversion of the sensor signal starts (sample & hold starts) until the A/D conversion data subjected to the temperature correction is output increases, and high speed processing of a control device that operates with the sensor signal as an input signal is prevented.

PRIOR ART LITERATURE

Patent Literature

PTL 1: JP-A-2004-85562

SUMMARY OF INVENTION

It is an object of the present disclosure to provide a sensor signal processing apparatus and a sensor apparatus which are capable of reducing a time required since the A/D conversion of a sensor signal starts until A/D conversion data in which the temperature characteristic of a physical quantity sensor is canceled is output.

A sensor signal processing apparatus according to one aspect of the present disclosure includes a first A/D converter, a second A/D converter, and a control unit. The sensor signal processing apparatus subjects a sensor signal, which is output from a physical quantity sensor, to A/D conversion and outputs a converted signal. The first A/D converter is capable of changing an offset and a conversion gain for an input signal, and subjects the sensor signal to A/D conversion as the input signal. The second A/D converter subjects a temperature signal, which is output from a temperature sensor detecting a temperature of the physical quantity sensor, to A/D conversion.

The control unit executes a temperature measurement process, a calculation process, and a signal conversion process, and executes at least any one of the temperature measurement process and the calculation process in parallel with the signal conversion process. In the temperature measurement process, the control unit causes the second A/D converter to subject the temperature signal to the A/D conversion. In the calculation process, the control unit calculates the offset and the conversion gain of the first A/D converter based the an A/D conversion value output from the second A/D converter and pre-prepared temperature characteristic data of the physical quantity sensor so that in process of subjecting the sensor signal to A/D conversion, the first A/D converter cancels a temperature characteristic of the physical quantity sensor. In the signal conversion process, the control unit sets the offset and the conversion gain, which are calculated by the control unit in the calculation process, to the first A/D converter, and causes the first A/D converter to subject the sensor signal to the A/D conversion.

In the sensor signal processing apparatus, A/D conversion characteristics (offset and conversion gain) of the first A/D converter are set to such A/D conversion characteristics that cancel the temperature characteristic of the physical quantity sensor. For that reason, the temperature characteristic of the physical quantity sensor is canceled during the A/D conversion. As a result, the time required since the A/D conversion of the sensor signal starts until the A/D conversion data in which the temperature characteristic of the physical quantity sensor is canceled is output does not include a time required to execute the temperature measurement process and the calculation process, and is determined according to an A/D conversion time of the first A/D converter. The use of the sensor signal processing apparatus enables high speed processing of the control device that operates with the sensor signal as an input signal.

A sensor apparatus according to another aspect of the present disclosure includes a physical quantity sensor, a temperature sensor that detects a temperature of the physical quantity sensor, and the above-described sensor signal processing apparatus.

BRIEF DESCRIPTION OF DRAWINGS

The above or other objects, features and advantages of the present disclosure will become more apparent from the following detailed description made with reference to the accompanying drawings. In the drawings:

FIG. 3 is a diagram illustrating a flow of signal processing;

DESCRIPTION OF EMBODIMENTS

Figure 1:
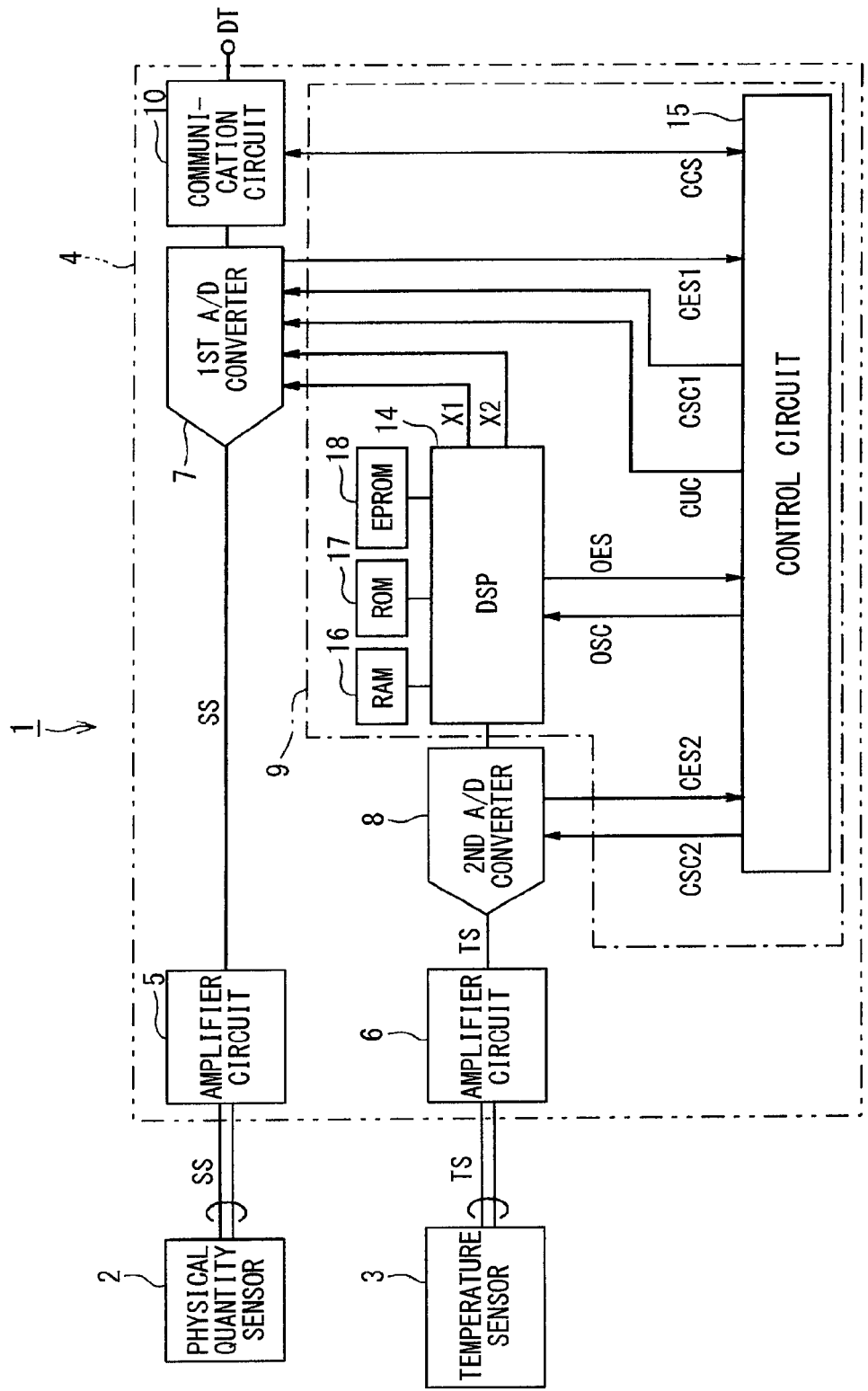
FIG. 1 is a block diagram illustrating a sensor apparatus according to a first embodiment.

Hereinafter, in the below embodiments, like references are used to refer to like parts to omit redundant explanation on the like parts.

(First Embodiment)

Hereinafter, a first embodiment of the present disclosure will be described with reference to FIGS. 1 to 8. A sensor apparatus 1 illustrated in FIG. 1 includes a physical quantity sensor 2, a temperature sensor 3, and a sensor signal processing apparatus 4.

The physical quantity sensor 2 is frequently configured in a dedicated sensor element chip different from a signal processing circuit chip. The physical quantity sensor 2 outputs a sensor signal SS corresponding to a physical quantity such as a pressure, a current, a magnetism, or a light. For example, when the pressure is detected, a rear surface of a semiconductor substrate is etched to form a thin diaphragm, and a front surface of the semiconductor substrate is formed with a wheatstone bridge having four semiconductor diffusion resistors large in piezoresistive effect as a strain gauge. The diaphragm is deflected due to a pressure difference between the front and rear surfaces of the chip, and the strain gauge detects the strain, and outputs the sensor signal SS of a differential type.

Because there is a variation in the resistances of the diffusion resistors, an offset occurs in the sensor signal SS. Because the diffusion resistors have a temperature characteristic, the offset also has the temperature characteristic. Further, because the piezoresistive effect of the diffusion resistors has the temperature characteristic, the sensitivity also has the temperature characteristic.

The temperature sensor 3 outputs a temperature signal TS of a differential type corresponding to the temperature of the physical quantity sensor 2. In this embodiment, the temperature sensor 3 detects a temperature in the vicinity of the physical quantity sensor 2. The sensor signal processing apparatus 4 executes the A/D conversion of the sensor signal SS while canceling the temperature characteristic provided in the sensor signal SS, and outputs A/D conversion data DT. The sensor signal processing apparatus 4 is configured as a signal processing IC in which amplifier circuits 5, 6, a first A/D converter 7, a second A/D converter 8, a control unit 9, and a communication circuit 10 are formed. The respective amplifier circuits 5 and 6 are provided to convert the sensor signal SS and the temperature signal TS of the differential type into signals of a single end type. Those amplifier circuits 5 and 6 may be omitted when the A/D converters 7 and 8 provide a differential input type.

Figure 2:
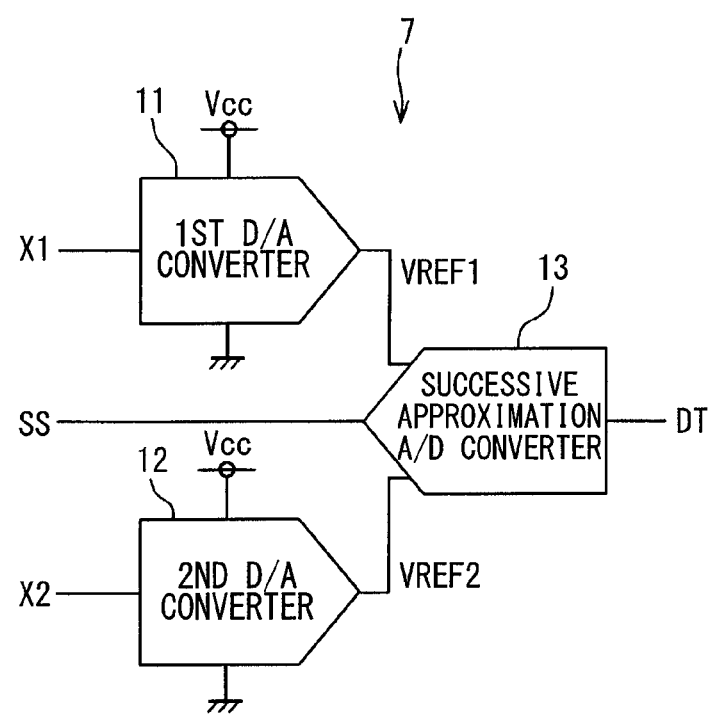
FIG. 2 is a block diagram illustrating a first A/D converter.

The first A/D converter 7 can change an offset and a conversion gain for the input signal, and subjects the input sensor signal to A/D conversion by m bits. As illustrated in FIG. 2, the first A/D converter 7 includes a first D/A converter 11 that receives a digital value X1, a second D/A converter 12 that receives a digital value X2, and a successive approximation A/D converter 13. The successive approximation A/D converter 13 has the offset and the conversion gain set according to reference voltages VREF1 and VREF2 output from the respective D/A converters 11 and 12, and subjects the sensor signal SS to A/D conversion.

The second A/D converter 8 subjects the temperature signal TS output from the temperature sensor 3 to A/D conversion. The offset and the conversion gain of the second A/D converter 8 are kept constant. In this embodiment, it is assumed that the temperature characteristics of the amplifier circuits 5, 6 and the A/D converters 7, 8 are sufficiently small. Although not shown, each of the A/D converters 7 and 8 includes a sample & hold circuit as occasion demands. The communication circuit 10 transmits the A/D conversion data DT output from the first A/D converter 7 to an electronic control unit (ECU) in a vehicle pursuant to, for example, a single edge nibble transmission (SENT) standard. The communication circuit 10 may be replaced with a serial communication circuit or an output circuit of a parallel output type.

The control unit 9 includes a digital signal processor (DSP) 14, a control circuit 15, a random access memory (RAM) 16, a read only memory (ROM) 17, and an erasable programmable read only memory (EPROM) 18. The DSP 14 calculates the offset and the conversion gain of the first A/D converter 7 so as to cancel the temperature characteristic of the physical quantity sensor 2 in a process in which the first A/D converter 7 subjects the sensor signal SS to A/D conversion on the basis of the A/D conversion value output from the second A/D converter 8, and the temperature characteristic data of the physical quantity sensor 2 prepared in advance.

A calculation program to be executed by the DSP 14 is stored in the ROM 17. The RAM 16 is a memory for execution of the calculation program. The temperature characteristic data of the physical quantity sensor 2 is stored in the EPROM 18. The control circuit 15 executes a temperature measurement process that allows the second A/D converter 8 to execute the A/D conversion of the temperature signal TS, a calculation control process that allows the DSP 14 to execute a calculation process, a signal conversion process that sets the calculated offset and conversion gain for the first A/D converter 7, and allows the first A/D converter 7 to execute the A/D conversion of the sensor signal SS, and a communication control process that allows the communication circuit 10 to output the A/D conversion data DT.

Subsequently, the operation of this embodiment will be described with reference to FIGS. 3 to 8. As illustrated in FIG. 3, the control circuit 15 allows the second A/D converter 8, the DSP 14, and the first A/D converter 7 to execute the temperature measurement process, the calculation process, and the signal conversion process in parallel, respectively. FIG. 3 illustrates a configuration in which the respective processes are executed in synchronization at fixed intervals. In this configuration, the respective processes are executed with a fixed time relationship with each other. If processing times of the respective processes are different from each other, wait occurs in a part of the processes. Therefore, the respective processes are sequentially executed without waiting time while being not synchronized, and processing at a subsequent stage using that processing result may use the latest processing result at a previous stage.

When the control circuit 15 provides the second A/D converter 8 with a conversion start command CSC2 at a time t1, the second A/D converter 8 samples and holds the temperature signal TS, and executes the A/D conversion (temperature measurement process). Upon completion of the conversion, the second A/D converter 8 outputs the obtained temperature data to the DSP 14, and outputs a conversion end signal CES2 to the control circuit 15.

When the control circuit 15 provides the DSP 14 with a calculation start command OSC at a time t2, the DSP 14 calculates the offset and the conversion gain of the first A/D converter 7 which are required to cancel the temperature characteristics (offset, sensitivity) of the physical quantity sensor 2 (calculation process). In fact, the DSP 14 calculates the digital values X1 and X2 corresponding to the reference voltages VREF1 and VREF2 associated with the offset and the conversion gain, respectively. Upon completion of the calculation, the DSP 14 outputs the obtained digital values X1 and X2 to the first A/D converter 7, and outputs a calculation end signal OES to the control circuit 15.

When the control circuit 15 provides the first A/D converter 7 with a characteristic update command CUC at a time t3, the first A/D converter 7 sets the digital values X1 and X2. Subsequently, when the control circuit 15 provides the first A/D converter 7 with a conversion start command CSC1, the first A/D converter 7 samples and holds the sensor signal SS, and executes the A/D conversion (signal conversion process). In a process of the A/D conversion, the temperature characteristic of the physical quantity sensor 2 is canceled. Upon completion of the conversion, the first A/D converter 7 outputs the obtained A/D conversion data DT to the communication circuit 10, and outputs a conversion end signal CES1 to the control circuit 15. When the control circuit 15 provides the communication circuit 10 with a communication control signal CCS at the respective times t1, t2, . . . , the communication circuit 10 transmits the A/D conversion data DT indicative of the physical quantity to the ECU.

Figure 4A:
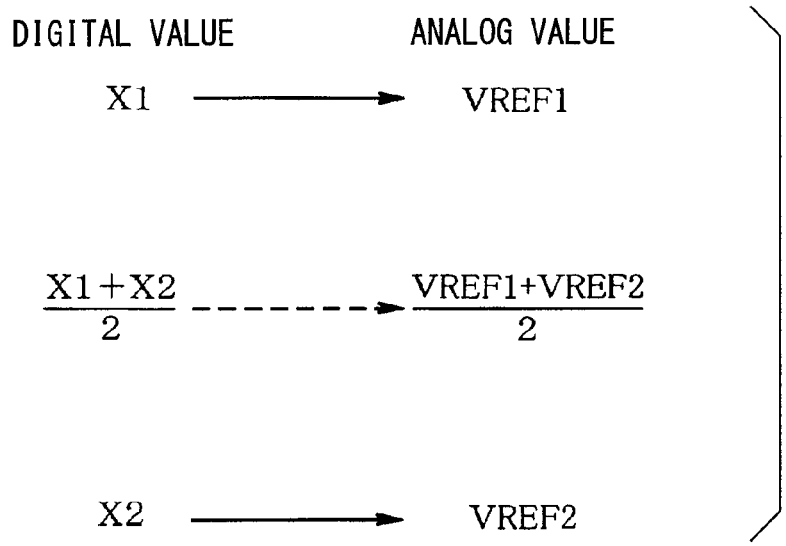
FIG. 4A is a diagram illustrating conversion characteristics of first and second D/A converters.
Figure 4B:
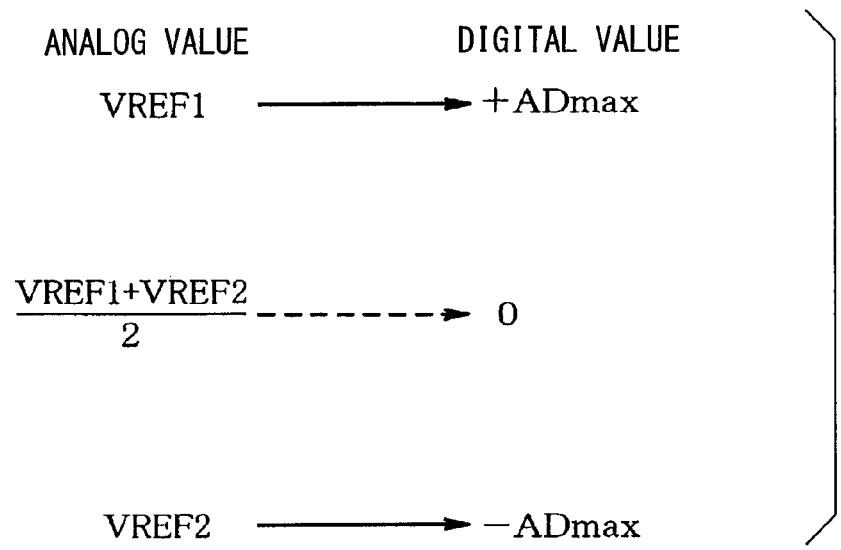
FIG. 4B is a diagram illustrating conversion characteristics of a successive approximation A/D converter.

FIG. 4A illustrates the conversion characteristics of the first D/A converter 11 and the second D/A converter 12, and FIG. 4B illustrates the conversion characteristic of the successive approximation A/D converter 13. The D/A converters 11 and 12 receive the digital values X1 and X2, and outputs the reference voltages VREF1 and VREF2 represented by Expressions (1) and (2), respectively. DAmax is maximum input data of the D/A converters 11 and 12, and Vcc is a supply voltage of the D/A converters 11 and 12.

$$\text{Reference voltage } VREF1=(X1/DA\text{max})*Vcc \qquad (1)$$

$$\text{Reference voltage } VREF2=(X2/DA\text{max})*Vcc \qquad (2)$$

A reference value that is a central value between the reference voltages VREF1 and VREF2 is represented by Expression (3), and a reference width that is a difference between the reference voltages VREF1 and VREF2 is represented by Expression (4).

$$\text{Reference value}=(VREF1+VREF2)/2=Vcc/(2*DA\text{max})*(X1+X2) \qquad (3)$$

$$\text{Reference width}=VREF1-VREF2=Vcc/DA\text{max}*(X1-X2) \qquad (4)$$

The successive approximation A/D converter 13 converts an input voltage equal to the reference value into a code 0, converts the reference voltage VREF1 into +ADmax, and converts the reference voltage VREF2 into -ADmax. When the successive approximation A/D converter 13 is of m bits, the ADmax is 2m/2-1. In other words, the A/D conversion data DT output by the successive approximation A/D converter 13 is represented by Expression (5), and Expressions (3) and (4) are substituted into Expression (5) to obtain Expression (6).

$$DT=(\text{sensor signal-reference value})/(\text{reference width}/2)*AD\text{max} \qquad (5)$$

$$DT=AD\text{max}/(X1-X2)*\{\text{sensor signal}*(2*DA\text{max}/Vcc)-(X1+X2)\} \qquad (6)$$

In this example, when K1 and K2 are defined by Expressions (7) and (8), respectively, the A/D conversion data DT is represented by Expression (9).

$$K1=(2*AD\text{max}*DA\text{max})/Vcc \qquad (7)$$

$$K2=AD\text{max} \qquad (8)$$

$$DT=K1*\text{sensor signal}/(X1-X2)-K2*(X1+X2)/(X1-X2) \qquad (9)$$

In other words, the offset of the first A/D converter 7 is set according to (X1+X2)/(X1-X2), and the conversion gain of the first A/D converter 7 is set according to 1/(X1-X2). The DSP 14 sets the digital values X1 and X2 on the basis of the temperature characteristic data and the measurement temperature of the physical quantity sensor 2 so that the temperature characteristic of the physical quantity sensor 2 is canceled by the conversion characteristics (offset and conversion gain) of the first A/D converter 7.

Subsequently, the calculation process to be executed by the DSP 14 will be described. In this example, it is assumed that an output characteristic of the physical quantity sensor 2 is adjusted to a value at a reference temperature (for example, 25° C.) in advance, in considering an offset correction value Ah and a gain correction coefficient g. In other words, when the physical quantity sensor 2 is at the reference temperature, it is assumed that the A/D conversion data DT output by the first A/D converter 7 is represented by Expression (10) with the use of a reference offset (0 in this example) and a reference conversion gain (1 in this example) provided in the first A/D converter 7. Symbol p is a physical quantity such as pressure. Symbols hr and sr are the offset and the sensitivity of the physical quantity sensor 2, respectively, when the physical quantity sensor 2 is at the reference temperature.

$$DT=hr+sr*p \qquad (10)$$

The physical quantity sensor 2 generally has a temperature characteristic. When the physical quantity sensor 2 is at t° C., the A/D conversion data DT output by the first A/D converter 7 is represented by Expression (11). As described above, it is assumed that the temperature characteristics of the first A/D converter 7 per se and the amplifier circuit 5 per se can be ignored. Symbols h and s represent the offset and the sensitivity of the physical quantity sensor 2, respectively, when the physical quantity sensor 2 is t° C.

$$DT=h+s*p \qquad (11)$$

When the offset h and the sensitivity s are approximated by third-order polynomials, the offset h and the sensitivity s are represented by Expressions (12) and (13), respectively. Symbols h1 and s1 are primary coefficients, h2 and s2 are secondary coefficients, and h3 and s3 are third-order coefficients.

$$h=hr*\{1+h1*(t-25)+h2*(t-25)^2+h3*(t-25)^3\} \qquad (12)$$

$$s=sr*\{1+s1*(t-25)+s2*(t-25)^2+s3*(t-25)^3\} \qquad (13)$$

With the use of the A/D conversion value of the temperature signal, the offset h represented by Expression (12) can be represented by Expression (14). Symbol T is the A/D conversion value of the temperature signal TS at t° C., and Tr is the A/D conversion value of the temperature signal TS at the reference temperature. Hr, H1, H2, and H3 used in this example are temperature coefficients (temperature characteristic data) related to the offset of the physical quantity sensor 2.

$$h=Hr^*\{1+H1^*(T-Tr)+H2^*(T-Tr)^2+H3^*(T-Tr)^3\} \quad (14)$$

Figure 5:
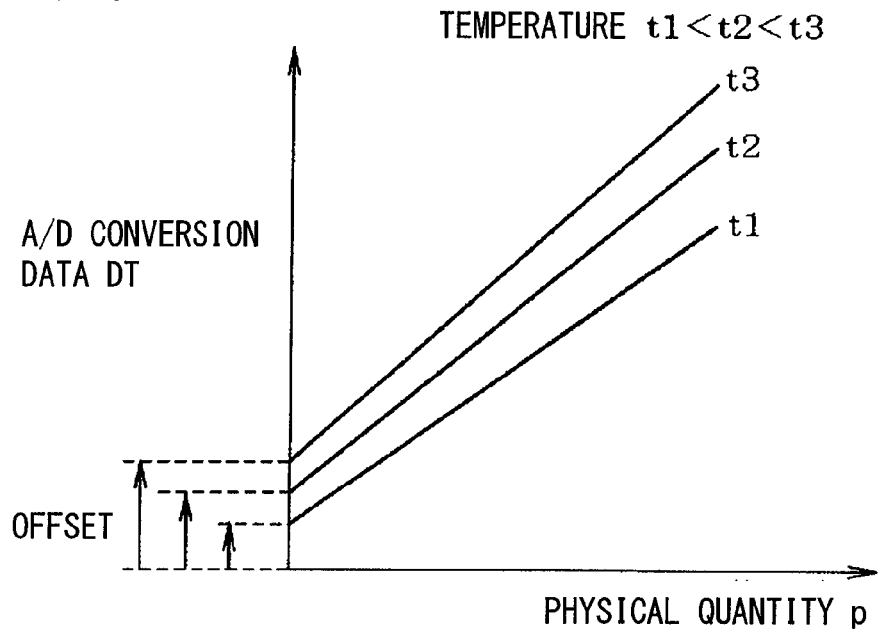
FIG. 5 is a graph showing a relationship between a physical quantity and A/D conversion data.

FIG. 5 showing a relationship between a physical quantity p and the A/D conversion data DT. The A/D conversion data DT when the physical quantity p is zero becomes a value obtained by adding the offset of the physical quantity sensor 2 to the offset (0 as described above) of the first A/D converter 7. An inclination of the graph becomes a value obtained by multiplying the sensitivity of the physical quantity sensor 2 by the conversion gain (1 as described above) of the first A/D converter 7.

In order to cancel the temperature characteristic related to the offset of the physical quantity sensor 2, the offset of the conversion characteristics of the first A/D converter 7 may be changed. In other words, the offset correction value Δh represented by Expression (15) is added to the reference offset provided in the first A/D converter 7 so that the offset h represented by Expression (14) becomes the offset hr.

$$\Delta h=-Hr^*\{H1^*(T-Tr)+H2^*(T-Tr)^2+H3^*(T-Tr)^3\} \quad (15)$$

Figure 6:
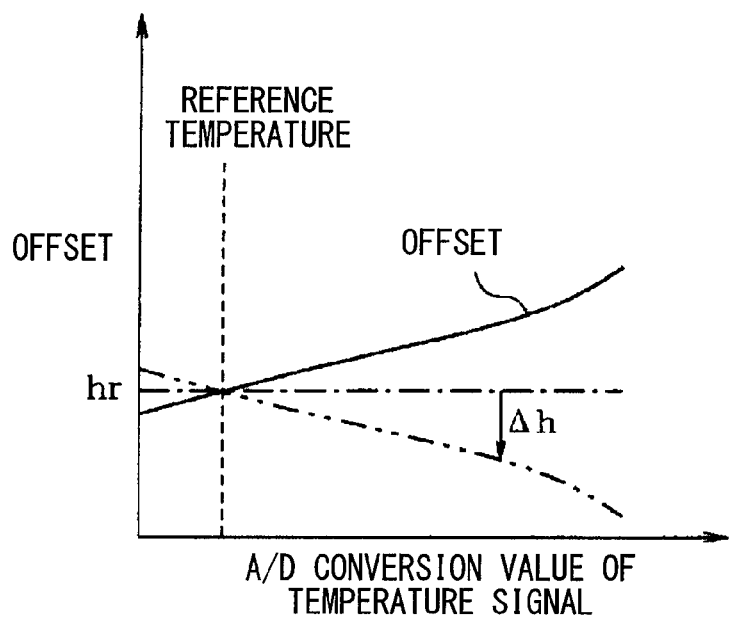
FIG. 6 is a graph showing a relationship between an A/D conversion value and an offset of a temperature signal.

FIG. 6 shows a relationship between the A/D conversion value and the offset of the temperature signal. A solid line indicates a total offset of the physical quantity sensor 2 and the first A/D converter 7. The offset hr indicated by a one-dot chain line represents a total offset of the physical quantity sensor 2 and the first A/D converter 7 when the physical quantity sensor 2 is at the reference temperature. In this example, as described above, the offset of the first A/D converter 7 is set to 0. Values obtained by folding back the total offset indicated by the solid line by the one-dot chain line are indicated by a two-dot chain line. The offset correction value Δh (=hr−h) represented by Expression (15) becomes equal to a difference (negative in this case) between the one-dot chain line and the two-dot chain line.

On the other hand, with the use of the A/D conversion value of the temperature signal, the sensitivity s represented by Expression (13) can be represented by Expression (16). Sr, S1, S2, and S3 used in this example are temperature coefficients (temperature characteristic data) related to the sensitivity of the physical quantity sensor 2.

$$s=Sr^*\{1+S1^*(T-Tr)+S2^*(T-Tr)^2+S3^*(T-Tr)^3\} \quad (16)$$

Further, the sensitivity coefficient Cs is defined by Expression (17).

$$Cs=s/sr=1+S1^*(T-Tr)+S2^*(T-Tr)^2+S3^*(T-Tr)^3 \quad (17)$$

Figure 7:
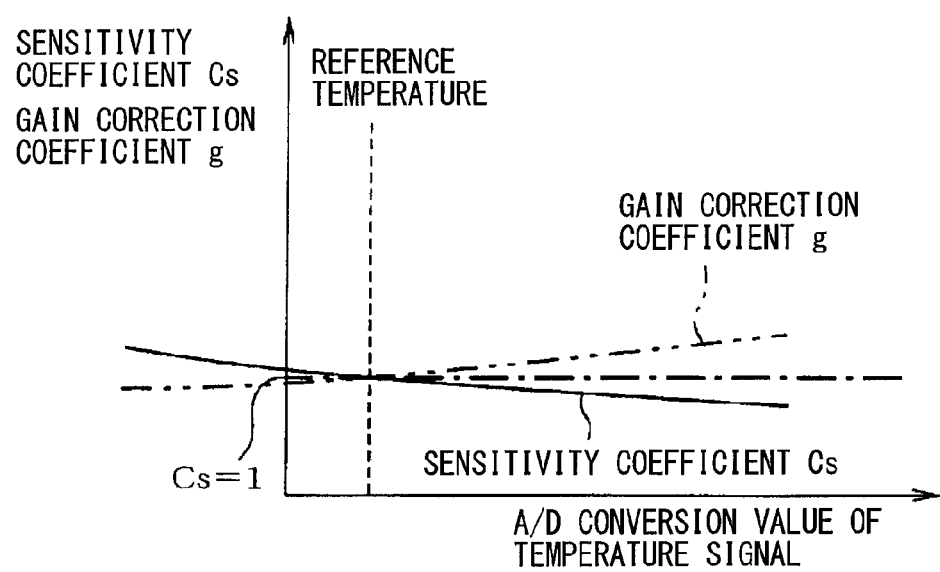
FIG. 7 is a graph showing a relationship between the A/D conversion value of the temperature signal, and a sensitivity coefficient and a gain correction coefficient.

In order to cancel the temperature characteristic related to the sensitivity of the physical quantity sensor 2, the conversion gain of the conversion characteristics of the first A/D converter 7 may be changed. In other words, the reference conversion gain provided in the first A/D converter 7 is multiplied by the gain correction coefficient g represented by Expression (18) so that the sensitivity s represented by Expression (16) becomes the sensitivity sr. FIG. 7 shows a relationship between the A/D conversion value of the temperature signal, and the sensitivity coefficient Cs and the gain correction coefficient g.

$$g = 1/Cs \quad (18)$$
$$= 1/\{1 + S1^*(T - Tr) + S2^*(T - Tr)^2 + S3^*(T - Tr)^3\}$$
$$= \{1 + S1^*(T - Tr) + S2^*(T - Tr)^2 + S3^*(T - Tr)^3\} - 1$$

In general, division takes time for calculation in comparison with multiplication. However, since the division is included in Expression (18), the expression is changed to a format having no division by using series expansion $(1+x)^{-1} \approx 1-x+x^2-x^3+\ldots$ when $1>|x|$, and the calculation speed can increase. For example, when $1>>|x|$, Expression (18) can be approximated by Expression (19) with the use of only a first-order term of x.

$$g \approx 1-\{S1^*(T-Tr)+S2^*(T-Tr)^2+S3^*(T-Tr)^3\} \quad (19)$$

Furthermore, taking the second and third order terms of x into account, when reviewing the respective coefficients up to the third order, the above expression can be approximated as Expression (20).

$$g \approx 1-\{S1'^*(T-Tr)+S2'^*(T-Tr)^2+S3'^*(T-Tr)^3\} \quad (20)$$

In this situation, the respective coefficients of Expression (20) satisfy the following relationships.

$$S1'=S1$$

$$S2'=S2+S1^2$$

$$S3'=S3+2^*S1^*S2+S1^3$$

The DSP 14 adds the offset correction value Δh to the reference offset of the first A/D converter 7 to obtain the offset, and multiplies the reference conversion gain of the first A/D converter 7 by the gain correction coefficient g to obtain the conversion gain. Thereafter, the DSP 14 determines the digital values X1 and X2 on the basis of Expression (9) so as to obtain those conversion characteristics.

According to this embodiment described above, since the conversion characteristics of the first A/D converter 7 is set to cancel the temperature characteristic of the physical quantity sensor 2, the temperature characteristic of the physical quantity sensor 2 can be canceled at the same time in a process of executing the A/D conversion of the sensor signal SS. As a result, a time since the sample & hold (times t1, t2, t3, . . . ) of the sensor signal SS until the A/D conversion data DT in which the temperature characteristic is canceled is output (times t2, t3, t4, . . . ) is reduced. This is because the time in question includes no execution time for the calculation process.

Figure 8:
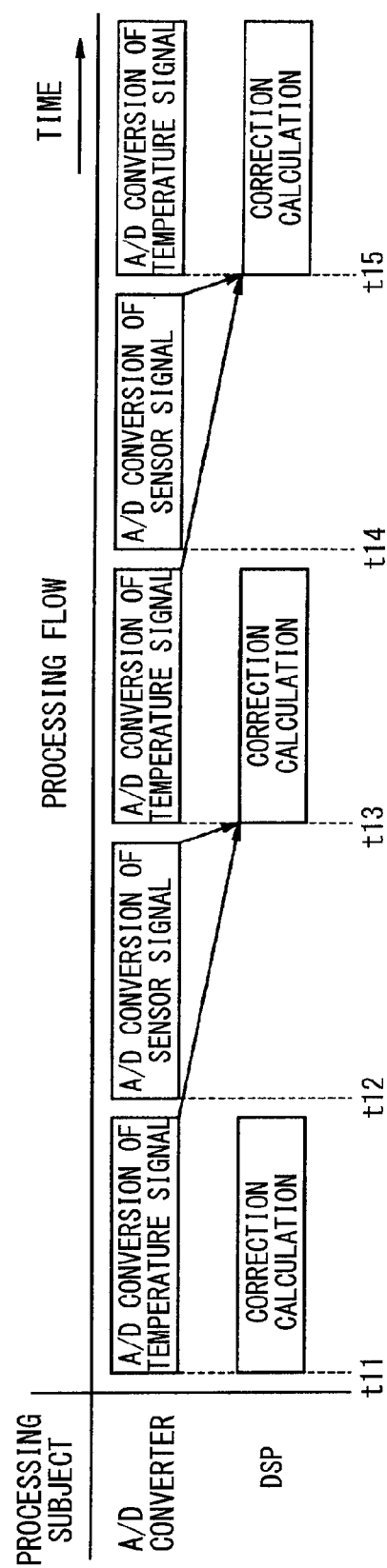
FIG. 8 is a diagram illustrating a flow of signal processing in a comparative example.

On the contrary, in the conventional configuration that sequentially executes the A/D conversion of the temperature signal TS, the A/D conversion of the sensor signal SS, and the correction calculation, a flow of the processing illustrated in FIG. 8 is obtained. A time since a time t12 when the sensor signal is sampled and held until the A/D conversion data DT is obtained through the correction calculation becomes longer because of the inclusion of a time required for the correction calculation. Even if the above configuration is changed to a configuration in which the temperature signal TS and the sensor signal SS are subjected to A/D conversion in parallel, the above delay time is not reduced. With the sensor signal processing apparatus 4 according to this embodiment, the high speed processing of a control device that operates with the sensor signal SS as the input signal, for example, an ECU of the vehicle is enabled.

(Second Embodiment)

Figure 9:
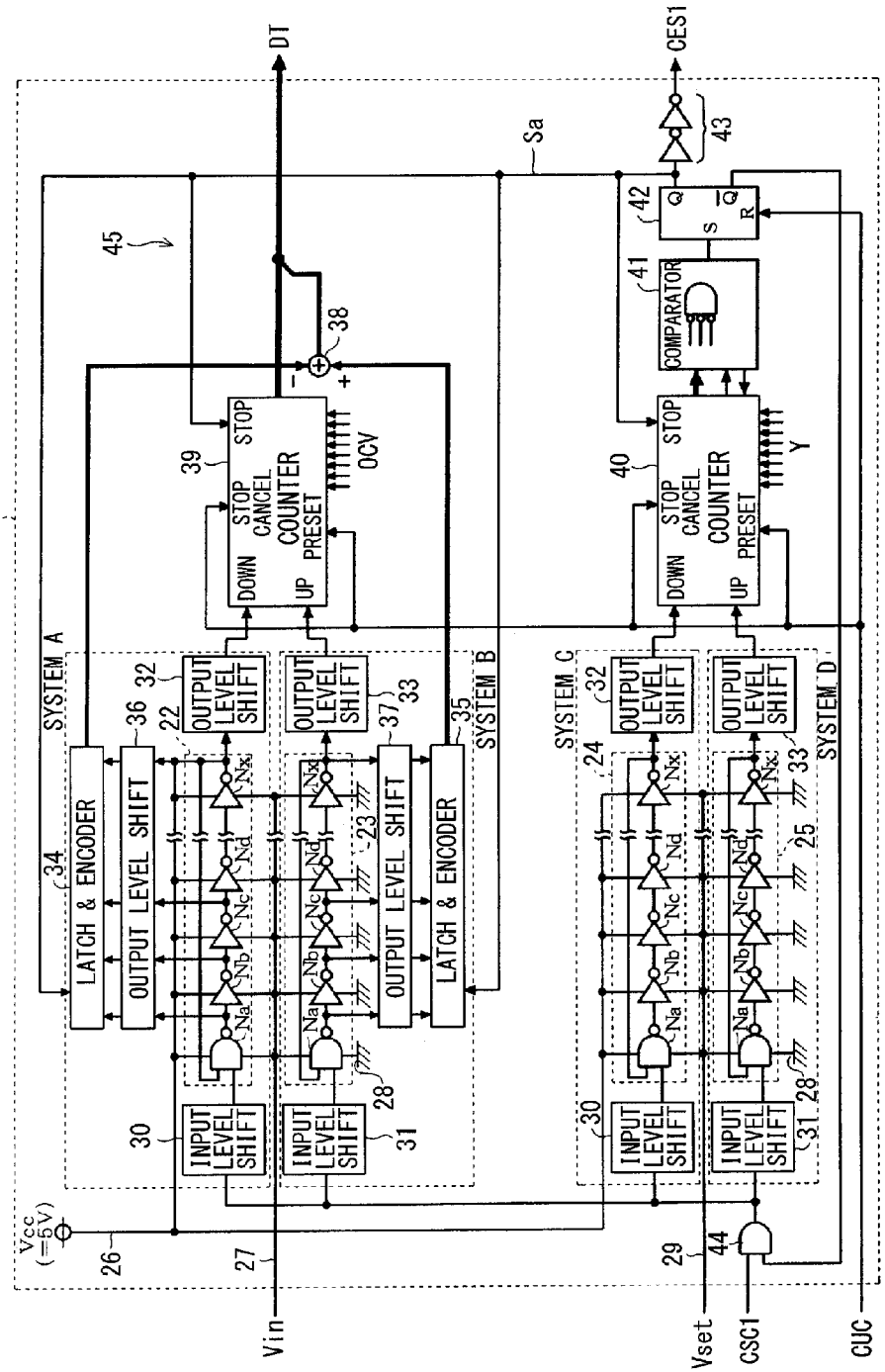
FIG. 9 is a block diagram illustrating a first A/D converter according to a second embodiment.

Hereinafter, a second embodiment will be described with reference to FIG. 9. An A/D converter 21 of a time A/D type can change an offset and a conversion gain, and can be used instead of the first A/D converter 7 described above. The first A/D converter 21 converts an analog input voltage Vin which is a sensor signal of a physical quantity sensor 2 into a digital value corresponding to a difference between the analog input voltage Vin and a reference voltage xref (=Vcc/2), and outputs the digital value as A/D conversion data DT.

The first A/D converter 21 includes a first pulse circulating circuit 22, a second pulse circulating circuit 23, a third pulse circulating circuit 24, and a fourth pulse circulating circuit 25. Each of those pulse circulating circuits 22 to 25 includes multiple and the same number of inverting circuits Na, Nb, . . . , Nx (delay units) connected in a ring shape. The inverting circuits output an input signal while being delayed by a delay time determined according to a supply voltage. The inverting circuits Na to Nx of the pulse circulating circuits 22 to 25 are thermally coupled with each other.

The first pulse circulating circuit 22 and the second pulse circulating circuit 23 operate as a pair, and the third pulse circulating circuit 24 and the fourth pulse circulating circuit 25 operate as a pair. The inverting circuits Na to Nx of the first pulse circulating circuit 22 receive the supply of a supply voltage (Vcc−Vin) from a specified voltage line 26 having a specified voltage Vcc (for example, 5V) and a signal input line 27 that receives the analog input voltage Vin. The supply voltage is equal to a voltage (2*xref−Vin) obtained by adding a positive and negative inversion voltage of a differential voltage obtained by subtracting a reference voltage xref from the analog input voltage Vin to the reference voltage xref. The inverting circuits Na to Nx of the second pulse circulating circuit 23 receives the supply of the analog input voltage yin from the signal input line 27 and a ground line 28.

The inverting circuits Na to Nx of the third pulse circulating circuit 24 receives the supply of a supply voltage (Vcc−Vset) from the specified voltage line 26 and a set voltage line 29 that receives a set voltage Vset. The supply voltage is equal to a voltage (2*xref−Vset) obtained by adding a positive and negative inversion voltage of a differential voltage obtained by subtracting the reference voltage xref from the set voltage Vset to the reference voltage xref. The inverting circuits Na to Nx of the fourth pulse circulating circuit 25 receive the supply of the set voltage Vset from the set voltage line 29 and the ground line 28.

A circuit portion of the first A/D converter 21 except for the pulse circulating circuits 22 to 25 operates upon receiving the supply of the specified voltage Vcc from the specified voltage line 26 and the ground line 28. Input level shift circuits 30 are disposed upstream of the respective pulse circulating circuits 22 and 24, and input level shift circuits 31 are disposed upstream of the pulse circulating circuits 23 and 25. Output level shift circuits 32 are disposed downstream of the respective pulse circulating circuits 22 and 24, and output level shift circuits 33 are disposed downstream of the respective pulse circulating circuits 23 and 25.

Latches and encoders 34 and 35 are disposed as first and second circulation position detector circuits in the first pulse circulating circuit 22 and the second pulse circulating circuit 23, for the purpose of detecting pulse positions in the pulse circulating circuits at the time of outputting the processing signals Sa, respectively. Output level shift circuits 36 and 37 are disposed between the first pulse circulating circuit 22 and the latch and encoder 34, and between the second pulse circulating circuit 23 and the latch and encoder 35, respectively.

Upon receiving the processing signal Sa of H level, the latch and encoder 34 receives output signals of the inverting circuits Na to Nx of the first pulse circulating circuit 22 in parallel. The latch and encoder 34 detects (encodes) the circulating position of the pulse signal in the first pulse circulating circuit 22 on the basis of those output signals, and outputs detection signals at a predetermined bit width (for example, 4 bits). The latch and encoder 35 is also configured in the same manner. A subtractor 38 subtracts position data output by the latch and encoder 34 from position data output by the latch and encoder 35, and sets a subtracted value at the time of receiving the processing signal Sa as, for example, lower four bits of the A/D conversion data DT.

A circuit including the first pulse circulating circuit 22, the latch and encoder 34, and the level shift circuits 30, 32, 36 may be called "system A". A circuit including the second pulse circulating circuit 23, the latch and encoder 35, and the level shift circuits 31, 33, 37 may be called "system B". A circuit including the third pulse circulating circuit 24 and the level shift circuits 30, 32 may be called "system C". A circuit including the fourth pulse circulating circuit 25 and the level shift circuits 31, 33 may be called "system D".

A first counter 39 is an up/down counter that counts the number of circulations of the pulse signals in the first pulse circulating circuit 22 and the number of circulations of the pulse signals in the second pulse circulating circuit 23, and outputs a difference value therebetween (for example, 14 bits). An output signal of the second pulse circulating circuit 23 is input to a count-up input terminal of the first counter 39, and an output signal of the first pulse circulating circuit 22 is input to a count-down input terminal thereof.

A characteristic update command is input to a preset terminal and a stop cancel terminal, and the processing signal Sa is input to a stop terminal. A preset value of the first counter 39 is given a value corresponding to the offset of the A/D converter 21. An output value of the first counter 39 at the time of receiving the processing signal Sa is set as, for example, higher 14 bits of the A/D conversion data.

A second counter 40 is an up/down counter that counts the number of circulations of the pulse signals in the third pulse circulating circuit 24 and the number of circulations of the pulse signals in the fourth pulse circulating circuit 25, and outputs a difference value therebetween (for example, 14 bits). An output signal of the fourth pulse circulating circuit 25 is input to a count-up input terminal of the second counter 40, and an output signal of the third pulse circulating circuit 24 is input to a count-down input terminal thereof.

A characteristic update command CUC is input to a preset terminal and a stop cancel terminal, and the processing signal Sa is input to a stop terminal. When the characteristic update command CUC is supplied to the preset terminal, a value (specified value Y) corresponding to the conversion gain of the first A/D converter 21 is set as preset data.

A comparator 41 for determining that all bits of an output value from the second counter 40 become 0 is disposed at a subsequent stage of the second counter 40. The second counter 40 outputs a determination completion signal of H level to the comparator 41 upon determination of the count value so that the comparator 41 can perform comparison after the output value of the second counter 40 has been determined. Upon receiving a comparison completion signal of H level from the comparator 41, the second counter 40 returns the determination completion signal to L level.

When a comparison result signal of H level indicating that all the bits are 0 is output from the comparator 41, an RS flip-flop 42 is set, and the processing signal Sa of H level is output from a terminal Q of the RS flip flop 42. The processing signal Sa becomes a conversion end signal through a delay element formed of an inverter 43. The Q/output of the RS flip-flop 42 is input to an AND gate 44.

A conversion start command CSC1 is supplied to the input level shift circuits 30 and 31 through the AND gate 44. Because the Q/output of the RS flip-flop 42 becomes L level at the time of completing the conversion, and the output of the AND gate 44 also becomes L level, the circulation of the pulse signal stops. In order to start the A/D conversion, after the characteristic update command CUC has been temporarily set to H level, the conversion start command CSC1 may change from L level to H level. The subtractor 38, the comparator 41, the RS flip-flop 42, and the AND gate 44 configure a conversion control circuit 45.

When the control circuit 15 illustrated in FIG. 1 supplies the characteristic update command CUC to the first A/D converter 21, an offset corresponding value OCV is preset in the first counter 39, and a specified value Y is preset in the second counter 40. The specified value Y is a value for determining the conversion gain as will be described later. When the set voltage Vset is higher than the voltage Vcc/2, since the count value of the second counter 40 increases, a complement of 2 of the specified value Y is preset in the second counter 40. When the set voltage Vset is lower than the voltage Vcc/2, since the count value of the second counter 40 decreases, the specified value Y is preset in the second counter 40.

When the control circuit 15 supplies the conversion start command CSC1 to the first A/D converter 21, the first to fourth pulse circulating circuits 22 to 25 start the pulse circulating operation at the same time. When the second counter 40 counts the specified value Y, and the count value becomes 0 in all the bits, the RS flip-flop 42 is set, and the processing signal Sa becomes H level. The first A/D converter 21 outputs the output value (higher 14 bits) of the first counter 39 at that time and the difference value (lower 4 bits) output by the latches and encoders 34 and 35 as the A/D conversion data DT for the analog input voltage Vin (sensor signal). The first A/D converter 21 outputs the conversion end signal CES1 to the control circuit 15. During the signal conversion process, the temperature characteristics of the physical quantity sensor 2 are canceled.

Subsequently, the conversion characteristics of the A/D converter 21 will be described. A supply voltage x (=set voltage Vset) is applied to the pulse circulating circuit 25 of the system D, and a supply voltage x' (=Vcc−Vset) is applied to the pulse circulating circuit 24 of the system C. As a result, Expressions (21) and (22) are always satisfied for the reference voltage xref. Δx is a differential voltage between the set voltage Vset and the reference voltage xref in the systems C and D. The reference voltage xref has a voltage value ½ times as large as the specified voltage Vcc, and the supply voltage x (=set voltage Vset) is set to be different from the reference voltage xref.

$$x = xref + \Delta x \quad (21)$$

$$x' = xref - \Delta x \quad (22)$$

Characteristics of the pulse circulating circuits of the systems A to D can be approximated by a quadratic function, and are set to be represented by Expressions (23) and (24), centered around the reference voltage xref. Symbols y and y' are the number of circulations per unit time when the supply voltages x and x' are applied to the pulse circulating circuits 25 and 24 of the systems D and C, respectively. Symbol yref is the number of circulations per unit time when the reference voltage xref is applied thereto when the A/D converter 21 is at the reference temperature (for example, 25° C.).

$$Y = A^*(\Delta x)2 + B^*(\Delta x) + yref \quad (23)$$

$$Y' = A^*(-\Delta x)2 + B^*(-\Delta x) + yref \quad (24)$$

The coefficient A is a secondary coefficient for Δx, and the coefficient B is a primary coefficient for Δx, which have the temperature characteristic. The following Expression (25) is established by Expressions (23) and (24).

$$y - y' = 2^*B^*\Delta x \quad (25)$$

It is found that a difference in the number of circulations y−y' per unit time between the systems D and C has no term for the secondary coefficient A which is a nonlinear component with respect to a voltage change Δx, and an excellent linearity is ensured. Since the pulse circulating circuit 22 of the system A and the pulse circulating circuit 23 of the system B also have the same configurations as those of the systems C and D, the linearity of the A/D conversion data is excellent similarly.

A time TAD (A/D conversion time) at which the different in the number of circulations of the pulse circulating circuits 24 and 25 of two systems having the systems C and D becomes Y is represented by Expression (26).

$$TAD = Y/(y - y') = Y/(2^*B^*\Delta x) \quad (26)$$

Similarly, in the systems A and B, when the supply voltage of the pulse circulating circuit 23 in the system B increases by ΔxAB, and the supply voltage of the pulse circulating circuit 22 in the system A decreases by ΔxAB. A voltage when the supply voltages to the pulse circulating circuits in the systems A and B become equal to each other becomes xref. Therefore, Expression (25) is satisfied as with the systems C and D except that the set voltage Vset is replaced with the analog input voltage Vin. It is assumed that the set voltage Vset and the analog input voltage Vin are set in a voltage range where the characteristics of the pulse circulating circuits 22 to 25 can be approximated by a quadratic function.

When the pulse circulating circuits 22 to 25 in the systems A to D start the pulse circulating operation at the same time, a difference in the number of circulations YAB between the pulse circulating circuits 22 and 23 of the two systems having the systems A and B during the elapse of the time TAD is presented by Expression (27). ΔxAB is a differential voltage Vin−xref between the analog input voltage Vin and the reference voltage xref in the systems A and B.

$$YAB = 2^*B^*\Delta xAB^*TAD = (\Delta xAB/\Delta x)XY \quad (27)$$

The difference in the number of circulations YAB per se becomes the A/D conversion data of the analog input voltage Vin viewed from the reference voltage xref (=Vcc/2). As is apparent from Expression (27), Δx cannot be set to 0 (x=xref). Expression (27) is a mathematical expression having no coefficients A and B with the temperature characteristic, and indicates that the obtained A/D conversion data YAB has no temperature characteristics of the first A/D converter 21 per se.

ΔxAB can obtain both of positive and negative according to the analog input voltage Vin. When the analog input voltage Vin is equal to the reference voltage xref, the A/D conversion data YAB=0 is met because of ΔxAB=0. When the analog input voltage Vin is equal to the set voltage Vset, the A/D conversion data YAB=Y is met because of ΔxAB=Δx. When the analog input voltage Vin is equal to −Vset, the A/D conversion data YAB=−Y is met because of ΔxAB=−Δx. In this way, since the voltage Δx (=Vset−xref) is converted into the specified value Y, the specified value Y determines a full scale code for the input width Δx, that is, the conversion gain.

The first A/D converter 21 described above has a very excellent linearity, maintains the excellent linearity regardless of an extensive change in temperature, and has a high conversion precision, in a voltage range where the characteristics of the pulse circulating circuits 22 to 25 in at least the reference voltage xref±Δx (xref=Vcc/2, Δx=Vset−xref) can be approximated by a quadratic function. Therefore, the first A/D converter 21 is replaced with the first A/D converter 7, thereby being capable of configuring the sensor apparatus with higher precision. The latches and encoders 34 and 35 may be provided as occasion demands.

(Third Embodiment)

Figure 10:
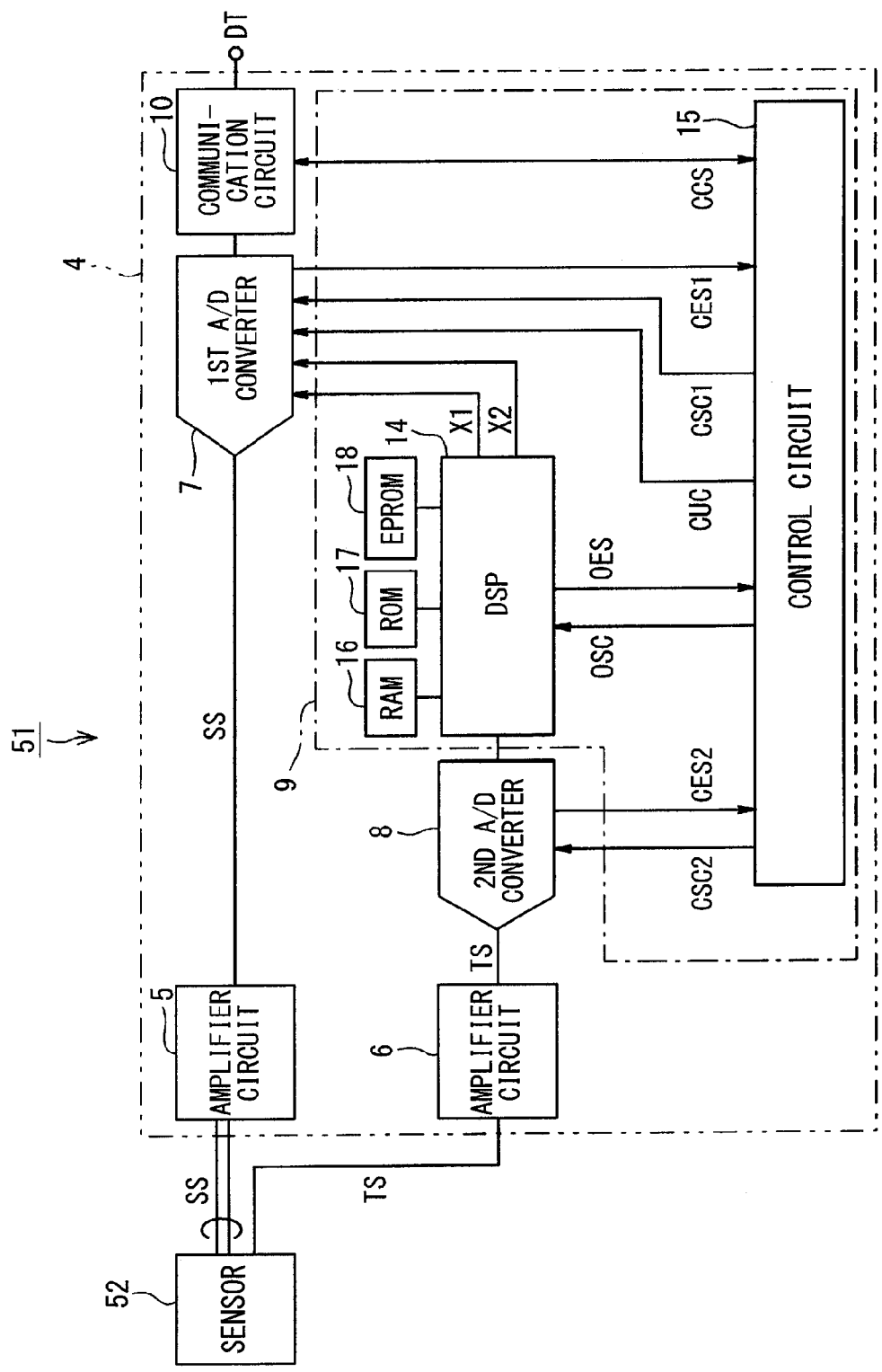
FIG. 10 is a block diagram illustrating a sensor apparatus according to a third embodiment.
Figure 11:
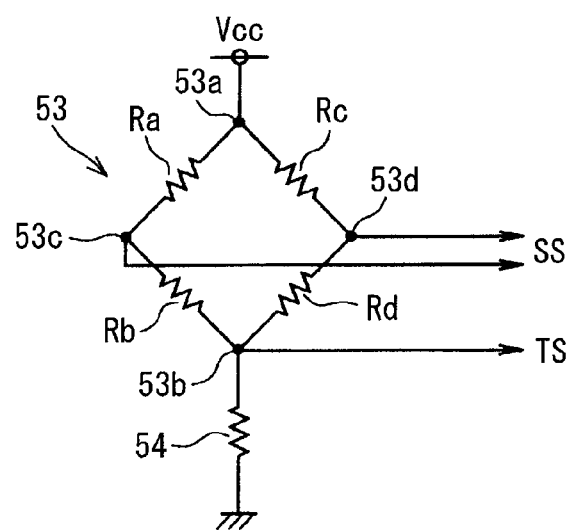
FIG. 11 is a diagram illustrating an electric configuration of a sensor.

Hereinafter, a third embodiment will be described with reference to FIGS. 10 and 11. A sensor apparatus 51 illustrated in FIG. 10 includes a sensor 52 in which a physical quantity sensor and a temperature sensor are integrated together, and a sensor signal processing apparatus 4 described in the first embodiment. As illustrated in FIG. 11, the sensor 52 for detecting a pressure includes a bridge circuit 53 having four semiconductor diffusion resistors (strain gauge resistors Ra to Rd which are sense resistors) formed on a semiconductor substrate, and a temperature detection resistor 54.

The bridge circuit 53 has a pair of drive terminals 53a, 53b, and a pair of signal output terminals 53c, 53d. Since the temperature detection resistor 54 is formed of a resistor of the type different from that of the strain gauge resistors Ra to Rd, the temperature detection resistor 54 has a temperature coefficient different from that of the bridge circuit 53, and can generate a temperature signal. The bridge circuit 53 and the temperature detection resistor 54 are connected in series between power lines to configure a half bridge. With the use of the sensor 52, there is no need to provide the temperature sensor in addition to the physical quantity sensor.

(Other Embodiments)

Preferred embodiments of the present disclosure have been illustrated above but the present disclosure is not limited to the above respective embodiments but can be modified and extended in various ways without departing from the spirit and scope of the invention.

The respective embodiments described above can be similarly applied to a physical quantity sensor for detecting a physical quantity such as a current, a magnetism, or a light other than the pressure. When the physical quantity sensor is a current sensor of the shunt resistance system, because a single resistor is used as a sensor element, no offset caused by the combination of multiple sensor elements occurs. However, the current sensor has the temperature characteristic of the sensitivity due to the temperature characteristic of the shunt resistance.

When the physical quantity sensor is a current sensor having a wheatstone bridge using four giant magneto resistive effect (GMR) elements, because the resistances of the respective elements and connection resistances between the elements and the lines are varied, offset occurs. Because those resistances have the temperature characteristics, the offset also has the temperature characteristic. Further, the sensitivity also has the temperature characteristic.

When the physical quantity sensor is a magnetic sensor of the hall element system, a wheatstone bridge is equivalently configured within the magnetic sensor, and the offset occurs. The offset has the temperature characteristic. Because the hall voltage also has the temperature characteristic, the sensitivity also has the temperature characteristic.

When the physical quantity sensor is an optical sensor of the photodiode system, an integration circuit having a capacitor and an operational amplifier integrates a current flowing in a photodiode. For that reason, the offset of the operational amplifier appears as the offset of the optical sensor.

The first A/D converter is not limited to the successive approximation type as in the first embodiment or the time A/D system as in the second embodiment if the offset and the conversion gain for the input signal can be changed. Any type of the second A/D converter is applicable.

It is desirable that the temperature sensor 3 is arranged in proximity to the physical quantity sensor 2, and thermally coupled with the physical quantity sensor 2. However, even if both of those sensors are distant from each other, if the temperatures of those sensors have a correlative relationship, the temperature characteristics can be canceled.

In the embodiments described above, for simplification of the description, the temperature characteristics of the first A/D converter 7 and the amplifier circuit 5 are set to be sufficiently small. However, when at least one of the first A/D converter 7 and the amplifier circuit 5 has an unignorable temperature characteristic, and the temperature of the first A/D converter 7 and the temperature of the amplifier circuit 5, and the temperature of the physical quantity sensor 2 have a correlative relationship, the temperature characteristic of the physical quantity sensor 2, and the temperature characteristic of the first A/D converter 7 and the temperature characteristic of the amplifier circuit 5 can be canceled together. In that case, a value obtained by adding the offset of the physical quantity sensor 2, the offset of the first A/D converter 7, and the offset of the amplifier circuit 5 may be set as the offset h represented by Expression (12). A value obtained by multiplying the sensitivity of the physical quantity sensor 2, the conversion gain of the first A/D converter 7, and the gain of the amplifier circuit 5 together may be set as the sensitivity s represented by Expression (13).

In the embodiments described above, all of the signal conversion process, the temperature measurement process, and the calculation process are executed in parallel. However, the signal conversion process may be executed in parallel with at least any one of the temperature measurement process and the calculation process. Even in this case, the time since sample & hold of the sensor signal until the A/D conversion data DT in which the temperature characteristic is canceled is output is reduced.

The invention claimed is:

1. A sensor signal processing apparatus that subjects a sensor signal, which is output from a physical quantity sensor, to A/D conversion and that outputs a converted signal, the sensor signal processing apparatus comprising:
   a first A/D converter that is capable of changing an offset and a conversion gain for an input signal, and that subjects the sensor signal to A/D conversion as the input signal;
   a second A/D converter that subjects a temperature signal to A/D conversion, wherein the temperature signal is output from a temperature sensor detecting a temperature of the physical quantity sensor; and
   a control unit that executes
      a temperature measurement process to cause the second A/D converter to subject the temperature signal to the A/D conversion,
      a calculation process to calculate the offset and the conversion gain of the first A/D converter based on an A/D conversion value output from the second A/D converter and pre-prepared temperature characteristic data of the physical quantity sensor so that the first A/D converter cancels a temperature characteristic of the physical quantity sensor in process of subjecting the sensor signal to A/D conversion with the calculated offset and conversion gain of the first A/D converter, and a signal conversion process to cause the first A/D converter to subject the sensor signal to the A/D conversion with the offset and the conversion gain calculated in the calculation process, wherein the control unit executes at least one of the temperature measurement process and the calculation process in parallel with the signal conversion process.

2. The sensor signal processing apparatus according to claim 1, wherein the first A/D converter comprises:

a first D/A converter that receives a digital value X1, and that outputs an analog voltage VREF1;

a second D/A converter that has the same conversion characteristic as the first D/A converter, and that receives a digital value X2 and outputs an analog voltage VREF2; and a successive approximation A/D converter that encodes a voltage range from the analog voltage VREF1 to the analog voltage VREF2 by a predetermined number of bits, wherein the control unit determines the digital values X1 and X2 and outputs the digital values X1 and X2 to the first D/A converter and the second D/A converter so that (X1+X2)/(X1−X2) becomes a value corresponding to the calculated offset and that 1/(X1−X2) becomes a value corresponding to the calculated conversion gain.

3. The sensor signal processing apparatus according to claim 1, wherein the first A/D converter outputs A/D conversion data corresponding to a difference between an analog input voltage, which constitutes the sensor signal, and a predetermined reference voltage, wherein the first A/D converter comprises:

a first pulse circulating circuit that includes a plurality of delay units connected in a ring shape and circulates a pulse signal to the delay units, wherein the delay units delay the input signal by a delay time determined according to a supply voltage of the first pulse circulating circuit and output the delayed input signal, wherein the supply voltage of the first pulse circulating circuit is a voltage obtained by adding a positive/negative inversion voltage to the reference voltage, wherein the positive/negative inversion voltage is a positive/negative inversion of a differential voltage obtained by subtracting the reference voltage from the analog input voltage;

a second pulse circulating circuit that includes a plurality of delay units connected in a ring shape and circulates the pulse signal to the delay units, wherein the delay units delay the input signal by a delay time determined according to a supply voltage of the second pulse circulating circuit and output the delayed input signal, wherein the supply voltage of the second pulse circulating circuit is the analog input voltage;

a first counter that is capable of presetting a count value, and that counts the number of circulations of the pulse signal in the first pulse circulating circuit and the number of circulations of the pulse signal in the second pulse circulating circuit, and outputs a differential value between the numbers of circulations;

a third pulse circulating circuit that is given a set voltage different from the reference voltage, and that includes a plurality of delay units connected in a ring shape and circulates the pulse signal to the delay units, wherein the delay units delay the input signal by a delay time determined according to a supply voltage and output the delayed input signal, wherein the supply voltage of the third pulse circulating circuit is a voltage obtained by adding a positive/negative inversion voltage to the reference voltage, wherein a positive/negative inversion voltage is a positive/negative inversion of a differential voltage obtained by subtracting the reference voltage from the set voltage;

a fourth pulse circulating circuit that operates with the set voltage as the supply voltage, and that includes a plurality of delay units connected in a rink shape and circulates the pulse signal to the delay units, wherein the delay units delay the input signal by a delay time determined according to the supply voltage and output the delayed input signal;

a second counter that counts the number of circulations of the pulse signal in the third pulse circulating circuit and the number of circulations of the pulse signal in the fourth pulse circulating circuit, and outputs a differential value between the numbers of circulations; and a conversion control circuit that, after presetting a value corresponding to the offset to the first counter, causes the first to fourth pulse circulating circuits to start circulating the pulse signals at the same time and outputs a processing signal when the differential value output by the second counter reaches a specified value for determining the conversion gain, and outputs, as A/D conversion data for the analog input voltage, the differential value output by the first counter at a time when the differential value output by the second counter reaches the specified value for determining the conversion gain, wherein the delay units provided in each of the first to fourth pulse circulating circuits have the same total number of delay units, and are arranged thermally coupled with each other.

4. A sensor apparatus comprising:

a physical quantity sensor;

a temperature sensor that detects a temperature of the physical quantity sensor; and a sensor signal processing apparatus recited in claim 1.

5. The sensor apparatus according to claim 4, wherein each of the physical quantity sensor and the temperature sensor comprises:

a bridge circuit including sense resistors connected in a bridge configuration to form a pair of drive terminals and a pair of signal output terminals; and a temperature detection resistor having a temperature coefficient different than the sense resistors, and connected to the bridge circuit through the drive terminals, and wherein the bridge circuit and the temperature detection resistor are connected in series between a pair of power lines.

* * * * *